(12) United States Patent
Burl et al.

(10) Patent No.: US 6,211,677 B1
(45) Date of Patent: Apr. 3, 2001

(54) LUNG COIL FOR IMAGING HYPER-POLARIZED GAS IN AN MRI SCANNER

(75) Inventors: Michael Burl, Chagrin Falls; Michael A. Morich, Mentor, both of OH (US)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/075,117

(22) Filed: May 8, 1998

(51) Int. Cl.$^7$ .................................................. G01V 3/00
(52) U.S. Cl. ............................................................. 324/322
(58) Field of Search ................................... 324/322, 307, 324/309, 319, 318, 300; 600/422, 421, 410

(56) References Cited

U.S. PATENT DOCUMENTS

| | | | |
|---|---|---|---|
| 4,793,357 | 11/1986 | Lindstrom | 128/654 |
| 4,930,510 | 11/1988 | Lindstrom | 128/654 |
| 5,024,230 | 3/1989 | Lindstrom et al. | 128/654 |
| 5,075,624 | * 12/1991 | Bezjak | 324/318 |
| 5,303,707 | * 4/1994 | Young | 600/422 |
| 5,365,173 | 2/1993 | Zou et al. | 324/318 |
| 5,610,521 | * 3/1997 | Zou et al. | 324/318 |
| 5,617,859 | * 4/1997 | Souza et al. | 600/422 |
| 5,680,047 | 8/1995 | Srinivasan et al. | 324/318 |
| 5,783,943 | * 7/1998 | Mastandrea, Jr. et al. | 324/318 |
| 5,990,681 | * 10/1997 | Richard et al. | 324/318 |
| 5,998,999 | * 12/1999 | Richard et al. | 324/318 |
| 6,013,035 | * 1/2000 | Unger et al. | 600/562 |
| 6,081,120 | * 6/2000 | Shen | 324/318 |

* cited by examiner

Primary Examiner—Christine Oda
Assistant Examiner—Dixomara Vargas
(74) Attorney, Agent, or Firm—Fay, Sharpe, Fagan, Minnich & McKee, LLP

(57) ABSTRACT

In a magnetic resonance imaging apparatus, a whole-body RF coil (42) disposed circumferentially around an examination region (14) is tuned to a first Larmor frequency, e.g., that of hydrogen. A first transmitter (44) transmits RF signals at the first Larmor frequency. A first T/R switch (40) electronically switches the whole-body RF coil (42) between a transmit mode in which it is electronically connected to the first transmitter (44) for exciting resonance in hydrogen nuclei, and a receive mode in which it is electronically connected to a first receiver channel for demodulating magnetic resonance signals received from resonating hydrogen nuclei. An insertable lung coil (70) is positioned inside the whole-body RF coil (42) around the examination region. The lung coil (70) is tuned, while the whole-body RF coil (42) is enabled, to a second Larmor frequency corresponding to a non-hydrogen nuclei such that the tuning compensates for reactance from the whole-body RF coil that is inductively coupled to the lung coil. A second T/R switch (80) electronically switches the lung coil (70) between a second transmitter (82) for exciting resonance in non-hydrogen nuclei, and a second receiver channel.

22 Claims, 2 Drawing Sheets

LUNG COIL FOR IMAGING HYPER-POLARIZED GAS IN AN MRI SCANNER

BACKGROUND OF THE INVENTION

The present invention relates to the magnetic resonance arts. It finds particular application in conjunction with medical diagnostic magnetic resonance imaging and spectroscopy and will be described with particular reference thereto. However, it is to be appreciated that the present invention is also amenable to magnetic resonance imaging and spectroscopy for other applications.

In magnetic resonance imaging (MRI), a substantially uniform temporally constant main magnetic field is generated within an examination region. The main magnetic field polarizes the nuclear spin system of a subject being imaged within the examination region. Magnetic resonance is excited in dipoles which align with the magnetic field by transmitting radio frequency (RF) excitation signals into the examination region. Specifically, RF pulses transmitted via a radio frequency coil assembly tip the dipoles out of alignment with the main magnetic field and cause a macroscopic magnetic moment vector to precess around an axis parallel to the main magnetic field. The precessing magnetic moment, in turn, generates a corresponding radio frequency magnetic resonance signal as it relaxes and returns to its former state of alignment with the main magnetic field. The RF magnetic resonance signal is received by the RF coil assembly, and from received signals, an image representation and/or spectrum is reconstructed for display on a human viewable display.

The appropriate frequency for exciting resonance in selected dipoles is governed by the Larmor equation. That is to say, the precession frequency of a dipole in a magnetic field, and hence the appropriate frequency for exciting resonance in that dipole, is a product of the gyromagnetic ratio $\gamma$ of the dipole and the strength of the magnetic field. In a 1.5 T magnetic field, hydrogen ($^1$H) dipoles have a resonance frequency of approximately 64 MHz. Generally in magnetic resonance imaging, the hydrogen species is excited because of its abundance and because it yields a strong MR signal. As a result, typical magnetic resonance imaging apparatus are equipped with built-in whole-body RF coils tuned to the resonant frequency for hydrogen.

However, it has become diagnostically advantageous to excite and receive magnetic resonance signals from other species for imaging and spectroscopy applications in addition to or in conjunction with the hydrogen signal. For example, the analysis of magnetic resonance signals produced by phosphorous ($^{31}$P) nuclei is significant in that phosphorous is involved in many metabolic processes. Additionally, the utilization of hyper-polarized gases such as xenon ($^{129}$Xe) and helium three ($^3$He) also present certain advantages. Exciting Xe dissolved in a subjects blood is useful for brain images. Exciting the hyper-polarized gas introduced into a subjects lungs is useful for lung imaging and measuring of lung capacity.

However, different species have markedly different resonance frequencies. Phosphorous, xenon, and helium three have resonant frequencies of approximately 26 MHz, 17.6 MHz, and 49 MHz respectively in the same 1.5 T magnetic field. In order to excite and receive magnetic resonant signals from these species, a radio frequency coil tunable to each specific resonant frequency is employed.

Traditionally, double-tuned localized or surface coils have been employed for this purpose. However, such coils were limited in size and did not accommodate larger sections of a patient's anatomy. An increase in the size of the doubly-tuned radio frequency coils presents additional drawbacks due in part to the doubly-tuned RF coils' close proximity to the built-in RF coil tuned to the hydrogen resonant frequency. In larger doubly-tuned RF coils, strong coupling would occur between the built-in RF coil and the doubly-tuned RF coil which caused mode splitting in which neither mode would be at the hydrogen frequency. Furthermore, when the inserted coil was in transmit mode, voltages would be induced in the built-in, whole-body RF coil due to the coupling. Left unchecked, this presented the risk of potential damage to reception components such as the preamplifier, receiver, and the like.

The present invention contemplates a new and improved magnetic resonance apparatus which overcomes the above-referenced problems and others.

SUMMARY OF THE INVENTION

In accordance with one aspect of the present invention, a magnetic resonance imaging apparatus is provided. It includes a main magnet for generating a substantially uniform temporally constant main magnetic field through an examination region defined by the main magnet. A couch suspends a region of interest of a subject to be examined in the examination region. A gradient coil assembly generates substantially linear magnetic gradients in the main magnetic field across the examination region. A body RF coil situated at a periphery of the examination region is tuned to a first Larmor frequency corresponding to hydrogen nuclei. The body coil is selectively enabled and disabled. A first transmitter transmits RF signals at the first Larmor frequency. A first switch electronically switches the body RF coil between (i) a transmit mode in which the body RF coil is electronically connected to the first transmitter for exciting resonance in hydrogen nuclei disposed within the examination region, and (ii) a receive mode in which the body RF coil is electronically connected to a first receiver channel for receiving and demodulating magnetic resonance signals emitted from excited hydrogen nuclei as they relax. An insertable RF coil is positioned inside the body RF coil adjacent thereto. The insertable RF coil is tuned, while the body RF coil is enabled, to a second Larmor frequency corresponding to a non-hydrogen nuclei. A second transmitter is provided for transmitting RF signals at the second Larmor frequency. A second switch electronically switches the insertable RF coil between (i) a transmit mode in which the insertable RF coil is electronically connected to the second transmitter for exciting resonance in non-hydrogen nuclei disposed within the examination region, and a (ii) receive mode in which the insertable RF coil is electronically connected to a second receiver channel for receiving and demodulating magnetic resonance signals emitted from excited non-hydrogen nuclei as they relax. A reconstruction processor connected with the first and second receiver channels reconstructs the magnetic resonance signals from excited hydrogen and non-hydrogen nuclei into image or spectroscopy representations.

In accordance with another more limited aspect of the present invention, the non-hydrogen nuclei is one of xenon ($^{129}$Xe), helium three ($^3$He), and phosphorous (P).

In accordance with another more limited aspect of the present invention, the magnetic resonance imaging apparatus further includes a sequence control circuit which operates the first and second T/R switches such that the body RF coil is in the transmit mode when the insertable RF coil is in the transmit mode, and the body RF coil is in the receive mode when the insertable RF coil is in the receive mode.

In accordance with another more limited aspect of the present invention, the insertable RF coil is a lung coil for imaging the subject's lungs.

In accordance with another more limited aspect of the present invention, the insertable RF coil is a splitable birdcage coil having upper and lower sections. The splitable birdcage coil includes a number of trap circuits arranged such that the splitable birdcage coil is restricted from supporting signals of the first Larmor frequency.

In accordance with another more limited aspect of the present invention, the trap circuits are parallel resonant circuits tuned to the first Larmor frequency including parallel connected inductor capacitor pairs.

In accordance with another more limited aspect of the present invention, the splitable birdcage coil rests on the couch and has rigid upper and lower sections.

In accordance with another more limited aspect of the present invention, the splitable birdcage coil rests on the couch and has a rigid lower section and a flexible upper section.

In accordance with another aspect of the present invention, a magnetic resonance method is provided. Hyperpolarized gas is introduced into a region of interest of the subject being examined which is placed in a substantially uniform temporally constant main magnetic field. Magnetic gradients are generated in the main magnetic field across the region of interest and, via a first tuned coil, RF signals having a frequency for exciting resonance in hydrogen dipoles are transmitted into the region of interest. Signals emitted from the region of interest by resonating hydrogen dipoles are received via the first tuned coil. Via a second tuned coil whose tuning accounts for a capacitive coupling with the first tuned coil, RF signals having a frequency for exciting resonance in hyper-polarized gas dipoles are transmitted into the region of interest, and signals emitted from the region of interest by resonating hyper-polarized gas dipoles are received. Human viewable images are reconstructed of the region of interest from the received signals.

In accordance with a more limited aspect of the present invention, the method further includes performing a lung biopsy guided by the reconstructed human viewable images.

In accordance with a more limited aspect of the present invention, the hyper-polarized gas is one of xenon 129 and helium three.

In accordance with another aspect of the present invention, a magnetic resonance apparatus includes a main magnet for generating a magnetic field through an examination region, a first RF coil disposed circumferentially around the examination region for transmitting and receiving signals at a resonance frequency of a first molecular species, a subject support, and a second RF coil. The second RF coil is disposed circumferentially around the examination region and is tuned to a resonance frequency of a second molecular species different from the first resonance frequency. Circuitry in the second RF coil prevents the second RF coil from supporting signals of the first species resonance frequency and circuitry in the first RF coil prevents the first RF coil from supporting signals of the second species resonance frequency.

One advantage of the present invention is that it simultaneously images at least two different species.

Another advantage of the present invention is that the insertable RF coil can be installed into an MRI apparatus having a built-in RF body coil tuned to hydrogen and work with, rather than in spite of, the built-in RF body coil.

Another advantage of the present invention is that it provides an alternately tuned coil of sufficient size for imaging a subject's lungs.

Another advantage of the present invention is that it protects downstream reception components from damage.

Another advantage of the present invention resides in its improved performance for lung imaging.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

Figure 1:
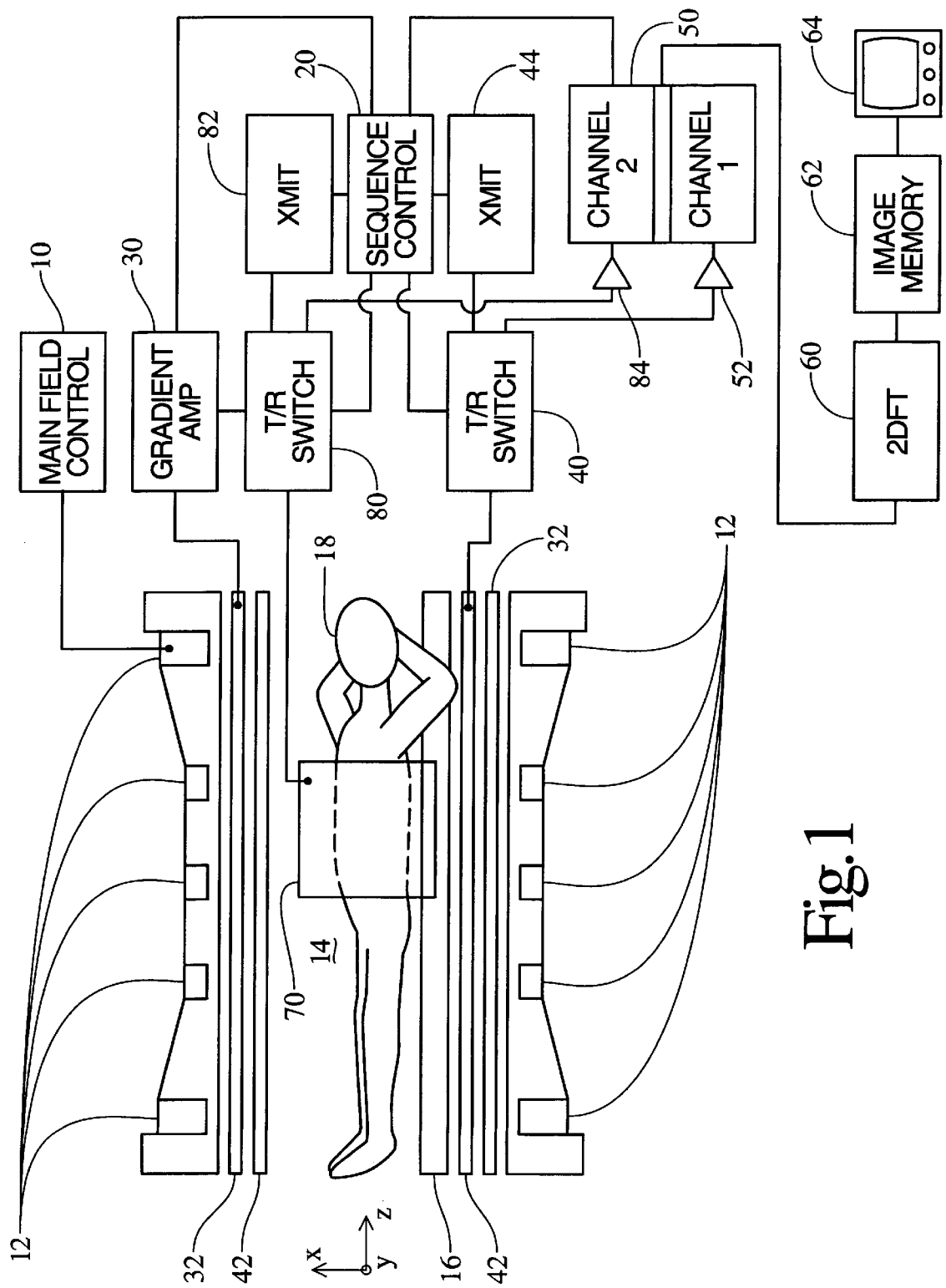
FIG. 1 is a diagrammatic illustration of a magnetic resonance apparatus in accordance with aspects of the present invention; and, FIG. 2 is a diagrammatic illustration of an end view of a lung coil in accordance with aspects of the present invention.

With reference to FIG. 1, a main magnetic field control 10 controls superconducting or resistive magnets 12 such that a substantially uniform, temporally constant main magnetic field $B_0$ is created along a z axis through an examination region 14. A couch 16 suspends a subject 18 to be examined at least partially within the examination region (i.e., so that a region of interest is in the examination region). In a preferred embodiment, the couch 16, and consequently the subject 18, is movable so that the subject 18 may be selectively placed in and removed from the examination region 14.

A magnetic resonance echo means operated under the control of a sequence control circuit 20 applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences.

More specifically, a gradient coil assembly selectively creates magnetic gradients in the main magnetic field across the examination region. Gradient current amplifiers 30 apply electrical current pulses to selected ones or pairs of whole-body gradient coils 32. Preferably, the whole-body gradient coils 32 are self shielded gradient coils for producing magnetic gradients along three mutually orthogonal axes, x, y, and z.

A transmit/receive (T/R) switch 40 under the control of the sequence control circuit 20 electronically switches a whole-body RF coil 42 between transmit and receive modes. In the transmit mode, a RF transmitter 44 (preferably a digital transmitter) is electronically connected and transmits RF pulses or pulse packets to a whole-body RF coil 42 to excite resonance in the $^1H$ species. A typical RF pulse is composed of a packet of immediately continuous pulse segments of short duration which taken together achieve a selected magnetic resonance manipulation. The RF pulses are used to saturate, excite resonance, invert magnetization, refocus resonance, or manipulate resonance in selected portions of the examination region 14. The whole-body RF coil 42 is tuned to the $^1$H resonance frequency and attached PIN diodes 46 (shown in FIG. 2) are selectively biased to enable and disable it. The PIN diodes are biased by a selectively applied DC potential to open and closed states to open or close connections between coil segments and/or between the coil segments and ground.

For whole-body applications, the signals from excited $^1$H dipoles as they relax are picked up by the whole-body RF coil 42. In the receive mode, the T/R switch 40 electronically connects the whole-body RF coil 42 to a channel of a receiver 50 (preferably a digital multi-channel receiver) via a preamplifier 52. The sequence control circuit 20 controls the gradient pulse amplifiers 30 and the RF transmitter 44 to generate any of a plurality of multiple echo sequences, such as echo-planar imaging, echo-volume imaging, gradient and spin echo imaging, fast spin echo imaging, and the like. For the selected sequence, the receiver 50 receives one or more resonance signals following each RF excitation pulse. Ultimately, the received RF signals are demodulated and reconstructed into an image representation by a reconstruction processor 60 which applies a two-dimensional Fourier transform or other appropriate reconstruction algorithm. The image may represent a planar slice through the patient, an array of parallel planar slices, a three-dimensional volume, or the like. The image is then stored in an image memory 62 where it may be accessed by a display, such as a video monitor 64 which provides a human viewable display of the resultant image.

Figure 2:
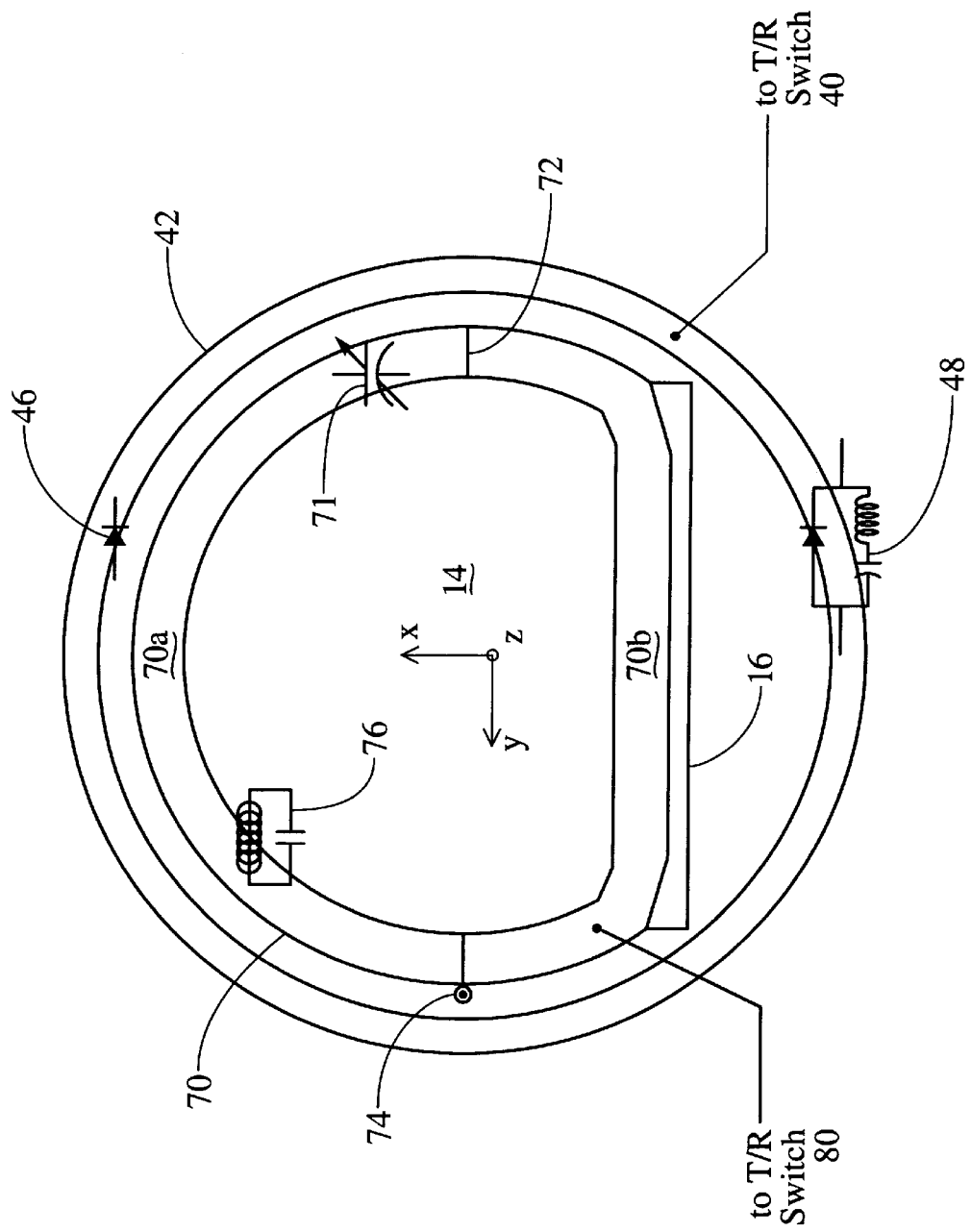

With reference to FIG. 2 and continuing reference to FIG. 1, an insertable lung coil 70 is utilized for imaging of the subject's 18 lungs. In a preferred embodiment, the subject 18 and the lung coil 70 rest on the couch 16 such that the subject's 18 lungs are positioned in the lung coil 70. With arms raised behind the head, the subject 18 is in a better position to have the lung coil 70 arranged high enough for full coverage of the lungs. The lung coil 70 is formed from upper and lower sections 70a and 70b, respectively. To ease entry and access, the lung coil 70 is splitable at junction 72 and opens about a hinge 74. Additionally, the lung coil 70 is fitted with a number of $^1$H traps, in the illustrated embodiment parallel resonant circuits 76 including a parallel connected inductor capacitor pair, that make the lung coil 70 transparent to the transmit field of the whole-body RF coil 42. In one embodiment, the traps are tuned to present open, signal blocking circuits at the whole body coil frequency and closed, signal passing circuits at the lung coil frequency. Optionally, other appropriate traps and/or circuits may be utilized that restrict the lung coil 70 from carrying signal of the frequency of the whole-body RF coil 42.

Optionally, the two section 70a and 70b are completely separable having a full break analogous to junction 72 in place of the hinged break 74. The coil portions on the top and bottom halves can be connected with pins and sockets, electro magnetically coupled by the tank circuits, capacitively coupled, or the like. On the other hand, the lung coil 70 may be made out of a single nonsplitable piece for appropriate applications.

In the preferred embodiment, the lung coil 70 is a birdcage coil (or other appropriate type coil) with rigid upper and lower sections 70a and 70b. The rigidity of the upper and lower sections 70a and 70b serves to fix the geometric and spatial relationship of the lung coil 70 with respect to surrounding structures and the subject 18. However, either or both sections 70a, 70b may be made flexible to achieve certain other advantages such as improved compatibility with subjects 18 of differing sizes.

Like the whole-body coil 42, the lung coil 70 is connected via a transmit/receive (T/R) switch 80, controlled by the sequence control circuit 20, to a RF transmitter 82 and a preamplifier 84 that feeds a second channel of the receiver 50 (optionally two separate receivers are employed). The lung coil 70 is tuned to an alternate resonance frequency for a species other than $^1$H. In a preferred embodiment, the lung coil 70 is tuned to the resonance frequency for a hyperpolarized polarized gas such as $^{129}$Xe, $^3$He, or the like. In this manner, the lungs of the subject 18 being examined can be imaged when the hyper-polarized gas is introduced. In particular, the hyper-polarized gas is imaged to generate images showing the lung cavity, absorption of the hyperpolarized gas, and the like. One advantage realized is an improved image due to the relative abundance of the resonant species (i.e. the hyper-polarized gas) as compared to the $^1$H present in the lung tissue. That is, the lungs are a "cavity" with inherently little tissue in which to excite resonance and generate an image.

The sequence control circuit 20 causes a selected imaging sequence to be generated for the lung coil 70 which excites dipoles of the hyper-polarized gas in the lungs of the subject 18. Ultimately, signals generated by the dipoles as they relax are: picked-up by the lung coil 70, received and demodulated by the receiver 50, reconstructed by the processor 60, and stored in the image memory 62 for selective viewing on the monitor 64.

In operation, when the lung coil 70 is in transmit mode currents tend to be induced in the whole-body RF coil 42 by their inductive coupling. These induced currents could, potentially, produce uncontrollable effects by forward conduction of the PIN diodes 46. Such induced currents could be carried down stream and damage preamplifiers and other downstream components. To protect against strong transmit signals from the lung coil 70 from being received by a disabled whole-body RF coil 42 despite the PIN diodes 46, the whole-body RF coil 42 is enabled. The sequence control circuit 20 puts the T/R switch 40 into the transmit mode such that the preamplifier 52 is not connected to the whole-body RF coil 42. Optionally, traps and/or band pass filters 48 that pass the $^1$H resonant frequency signal while restricting other frequencies are connected between the whole body RF coil 42 and the downstream components, such as the preamplifier 52.

This results in a small, but not negligible, capacitance being inductively coupled into the lung coil 70. The lung coil 70 is tuned, via adjustable capacitor 71 or other appropriate tuning circuit, with the whole-body RF coil 42 enabled in order to account for the effective capacitance from the whole-body RF coil and achieve optimum performance. To maintain the correct tuning when the lung coil is in the receive mode, the whole-body RF coil 42 is enabled during the receiving operation of the lung coil 70. Additionally, when the lung coil 70 is in receive mode, the whole-body RF coil 42 is also in receive mode to protect the second channel of the receiver 50 (the channel connected to the lung coil 70) from incoming noise from the RF transmitter 44.

While preferred embodiments above have been described with reference to a lung coil for imaging hyper-polarized gas, the invention herein is also amenable to other applications. The invention may be utilized to image other anatomical regions and/or other species. For example, a head coil could excite a hyper-polarized gas, such as $^{129}$Xe, dissolved in a subject's blood for brain imaging studies. The coil could be tuned to the resonant frequency for $^{31}$P to study metabolic processes of, for example, the heart or other muscle of interest.

Additionally, while illustrated for use in a central bore horizontal field type MRI apparatus, the invention is also applicable to open geometry MRI systems having an examination region defined between opposing pole pieces that are connected by a ferrous flux return path. Open geometry MRI systems provide certain advantages particularly in the case of interventional MRI applications. In either case, in at least one preferred embodiment of the invention herein, it is utilized for interventional applications such as an MRI guided lung biopsy procedure.

The invention has been described with reference to the preferred embodiments. Obviously, modifications and alterations will occur to others upon a reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus comprising:
    a main magnet for generating a main magnetic field through an examination region, said examination region having positioned therein a region of interest of a subject to be examined;
    a gradient coil assembly for generating magnetic gradients in the main magnetic field across the examination region;
    a body RF coil tuned to a first Larmor frequency corresponding to hydrogen nuclei, the body RF coil being selectively enabled and disabled;
    a first transmitter for transmitting RF signals at the first Larmor frequency;
    an insertable RF coil, said insertable RF coil being tuned, while the body RF coil is enabled, to a second Larmor frequency corresponding to a non-hydrogen nuclei;
    a second transmitter for transmitting RF signals at the second Larmor frequency;
    a switch array that concurrently electronically switches the body and insertable RF coils between (i) a transmit mode in which the body coil is electronically connected to the first transmitter and the insertable RF coil is electronically connected to the second transmitter for exciting resonance in one of hydrogen nuclei, non-hydrogen nuclei, and both the hydrogen and non-hydrogen nuclei disposed within the examination region, and (ii) a receive mode in which the body RF coil is electronically connected to a first receiver channel and the insertable RF coil is electronically connected to a second receiver channel for receiving and demodulating magnetic resonance signals emitted from excited hydrogen and non-hydrogen nuclei as they relax; and,
    a reconstruction processor connected with the first and second receiver channels for reconstructing the magnetic resonance signals from excited hydrogen and non-hydrogen nuclei into image representations.

2. The magnetic resonance imaging apparatus of claim 1, wherein the non-hydrogen nuclei is one of xenon ($^{129}$Xe), helium three ($^3$He), and phosphorous ($^{31}$P).

3. A magnetic resonance imaging apparatus comprising:
    a main magnet for generating a main magnetic field through an examination region, said examination region having positioned therein a region of interest of a subject to be examined;
    a gradient coil assembly for generating magnetic gradients in the main magnetic field;
    a first RF coil tuned to a first Larmor frequency corresponding to a first species of nuclei;
    a first transmitter for transmitting RF signals at the first Larmor frequency;
    a first switch that electronically switches the first RF coil between (i) a transmit mode in which the first RF coil is electronically connected to the first transmitter for exciting resonance in the first species of nuclei disposed within the examination region, and, (ii) a receive mode in which the first RF coil is electronically connected to a first receiver channel for receiving and demodulating magnetic resonance signals emitted from excited first species nuclei as they relax;
    a second RF coil, said second RF coil being tuned, while the first RF coil is enabled, to a second Larmor frequency corresponding to a second species of nuclei, said second species being different from the first species;
    a second transmitter for transmitting RF signals at the second Larmor frequency;
    a second switch that electronically switches the second RF coil between (i) a transmit mode in which the second RF coil is electronically connected to the second transmitter for exciting resonance in the second species of nuclei disposed within the examination region, and (ii) a receive mode in which the second RF coil is electronically connected to a second receiver channel for receiving and demodulating magnetic resonance signals emitted from excited second species nuclei as they relax; and,
    a reconstruction processor connected with the first and second receiver channels for reconstructing the magnetic resonance signals from excited first species and second species nuclei into image representations;
    a sequence control circuit which operates the first and second switches such that the first RF coil is in the transmit mode when the second RF coil is in the transmit mode, and the first RF coil is in the receive mode when the second RF coil is in the receive mode.

4. The magnetic resonance imaging apparatus of claim 1, wherein the non-hydrogen nuclei is the nuclei of a hyperpolarized gas.

5. The magnetic resonance imaging apparatus of claim 4, wherein the insertable RF coil is a lung coil for imaging the subject's lungs.

6. The magnetic resonance imaging apparatus of claim 5, wherein the insertable RF coil is flexible.

7. The magnetic resonance imaging apparatus of claim 5, wherein the insertable RF coil is a splitable birdcage coil having upper and lower sections, the splitable birdcage coil including a number of trap circuits arranged such that the splitable birdcage coil is restricted from supporting signals of the first Larmor frequency.

8. The magnetic resonance imaging apparatus of claim 7, wherein the trap circuits are parallel resonant circuits tuned to the first Larmor frequency including parallel connected inductor capacitor pairs.

9. The magnetic resonance imaging apparatus of claim 7, wherein the splitable birdcage coil rests on a couch and has rigid upper and lower sections, said couch positioning the subject within the examination region.

10. The magnetic resonance imaging apparatus of claim 7, wherein the splitable birdcage coil rests on a couch and has a rigid lower section and a flexible upper section, said couch positioning the subject within the examination region.

11. A magnetic resonance imaging apparatus comprising:

a main magnet for generating a main magnetic field through an examination region, said examination region having positioned therein a region of interest of a subject to be examined;

a gradient coil assembly for generating magnetic gradients in the main magnetic field;

a first RF coil tuned to a first Larmor frequency corresponding to a first species of nuclei;

a first transmitter for transmitting RF signals at the first Larmor frequency;

a first switch that electronically switches the first RF coil between (i) a transmit mode in which the first RF coil is electronically connected to the first transmitter for exciting resonance in the first species of nuclei disposed within the examination region, and, (ii) a receive mode in which the first RF coil is electronically connected to a first receiver channel for receiving and demodulating magnetic resonance signals emitted from excited first species nuclei as they relax;

a second RF coil, said second RF coil being tuned, while the first RF coil is enabled, to a second Larmor frequency corresponding to a second species of nuclei, said second species being different from the first species;

a second transmitter for transmitting RF signals at the second Larmor frequency;

a second switch that electronically switches the second RF coil between (i) a transmit mode in which the second RF coil is electronically connected to the second transmitter for exciting resonance in the second species of nuclei disposed within the examination region, and (ii) a receive mode in which the second RF coil is electronically connected to a second receiver channel for receiving and demodulating magnetic resonance signals emitted from excited second species nuclei as they relax; and, a reconstruction processor connected with the first and second receiver channels for reconstructing the magnetic resonance signals from excited first species and second species nuclei into image representations;

wherein at least one of the first and second RF coils includes at least one circuit which restricts it from supporting the Larmor frequency of the other.

12. The magnetic resonance imaging apparatus of claim 1, wherein the body RF coil is selectively enabled and disabled by biasing PIN diodes.

13. A magnetic resonance method comprising:

(a) introducing hyper-polarized gas into a region of interest of a subject being examined;

(b) placing the region of interest of the subject being examined in a main magnetic field;

(c) generating magnetic gradients in the main magnetic field across the region of interest;

(d) simultaneously transmitting into the region of interests (i) RF signals having a frequency for exciting resonance in hydrogen dipoles and (ii) RF signals having a frequency for exciting resonance in hyper-polarized gas dipoles;

(e) receiving signals emitted from the region of interest by both resonating hydrogen dipoles and resonating hyper-polarized gas dipoles; and, (h) reconstructing human viewable images of the region of interest from the received signals.

14. The method of claim 13, wherein the region of interest is the subject's lungs.

15. The method of claim 14, further including:

(i) performing a lung biopsy guided by the reconstructed human viewable images.

16. The method of claim 13, wherein the hyper-polarized gas is one of xenon 129 and helium three.

17. A magnetic resonance method comprising:

(a) introducing hyper-polarized gas into a region of interest of a subject being examined;

(b) placing the region of interest of the subject being examined in a main magnetic field;

(c) generating magnetic gradients in the main magnetic field across the region of interest;

(d) transmitting into the region of interest, via a first tuned coil, RF signals having a frequency for exciting resonance in hydrogen dipoles;

(e) receiving, via the first tuned coil, signals emitted from the region of interest by resonating hydrogen dipoles;

(f) transmitting into the region of interest, via a second tuned coil whose tuning accounts for a reactive coupling with the first tuned coil, RF signals having a frequency for exciting resonance in hyper-polarized gas dipoles;

(g) receiving, via the second tuned coil, signals emitted from the region of interest by resonating hyper-polarized gas dipoles; and, (h) reconstructing human viewable images of the region of interest from the received signals;

wherein the second tuned coil is tuned to the resonance frequency for the hyper-polarized gas dipoles while the first tuned coil is enabled.

18. A magnetic resonance method comprising:

(a) introducing hyper-polarized gas into a region of interest of a subject being examined;

(b) placing the region of interest of the subject being examined in a main magnetic field;

(c) generating magnetic gradients in the main magnetic field across the region of interest;

(d) transmitting into the region of interest, via a first tuned coil, RF signals having a frequency for exciting resonance in hydrogen dipoles;

(e) receiving, via the first tuned coil, signals emitted from the region of interest by resonating hydrogen dipoles;

(f) transmitting into the region of interest, via a second tuned coil whose tuning accounts for a reactive coupling with the first tuned coil, RF signals having a frequency for exciting resonance in hyper-polarized gas dipoles;

(g) receiving, via the second tuned coil, signals emitted from the region of interest by resonating hyper-polarized gas dipoles; and, (h) reconstructing human viewable images of the region of interest from the received signals;

wherein when the second tuned coil is set up for transmitting the first tuned coil is set up for transmitting and when the second tuned coil is set up for receiving the first tuned coil is set up for receiving.

19. A magnetic resonance apparatus having a main magnet for generating a magnetic field through an examination region, a first RF coil for transmitting and receiving signals at a resonance frequency of a first molecular species, and a second RF coil;

the second RF coil being tuned to a resonance frequency of a second molecular species different from the first resonance frequency;

circuitry in the second RF coil for preventing the second RF coil from supporting signals of the first species resonance frequency;

circuitry in the first RF coil for preventing the first RF coil from supporting signals of the second species resonance frequency.

20. A magnetic resonance apparatus having a main magnet for generating a magnetic field through an examination region, a first RF coil for transmitting and receiving signals at a resonance frequency of a first molecular species, and a second RF coil;

the second RF coil being tuned to a resonance frequency of a second molecular species different from the first resonance frequency;

circuitry in the second RF coil for preventing the second RF coil from supporting signals of the first species resonance frequency; and, circuitry in the first RF coil for preventing the first RF coil from supporting signals of the second species resonance frequency;

wherein the first RF coil inductively couples to the second RF coil contributing a tuned frequency altering resonance to the second RF coil and further including:

a tuning circuit for tuning the second RF coil with the resonance contributed by the first RF coil to the second species resonance frequency.

21. A The magnetic resonance apparatus having a main magnet for generating a magnetic field through an examination region, a first RF coil for transmitting and receiving signals at a resonance frequency of a first molecular species, and a second RF coil;

the second RF coil being tuned to a resonance frequency of a second molecular species different from the first resonance frequency;

circuitry in the second RF coil for preventing the second RF coil from supporting signals of the first species resonance frequency; and, circuitry in the first RF coil for preventing the first RF coil from supporting signals of the second species resonance frequency;

wherein the first RF coil is tuned to the resonance frequency of $^1H$ and th e second RF coil is tuned to the resonance frequency of a species other than $^1H$.

22. The magnetic resonance apparatus of claim 19 further including:

a switch for switching the first RF coil between transmit and receive modes; and a control circuit for concurrently controlling (i) the second RF coil to transmit a radio frequency pulse of the second resonance frequency and (ii) the switch to switch the first RF coil into the transmit mode disconnecting it from downstream receiving circuitry.

* * * * *